United States Patent [19]

Tijburg et al.

[11] 4,341,010
[45] Jul. 27, 1982

[54] FABRICATION OF ELECTROLUMINESCENT SEMICONDUCTOR DEVICE UTILIZING SELECTIVE ETCHING AND EPITAXIAL DEPOSITION

[75] Inventors: Rudolf P. Tijburg; Teunis van Dongen, both of Eindhoven, Netherlands

[73] Assignee: U.S. Philips Corporation, New York, N.Y.

[21] Appl. No.: 141,511

[22] Filed: Apr. 18, 1980

[30] Foreign Application Priority Data

Apr. 24, 1979 [NL] Netherlands ........................ 7903197

[51] Int. Cl.³ .................... H01L 21/308; H01L 21/20
[52] U.S. Cl. ................................. 29/580; 29/569 L; 29/578; 148/175; 156/644; 156/649; 156/653; 156/657; 357/55; 357/56; 357/60
[58] Field of Search ....................... 29/578, 580, 569 L; 148/175; 156/644, 648, 649, 653, 657; 357/18, 55, 56, 60; 331/94.5 H

[56] References Cited

U.S. PATENT DOCUMENTS

| | | | |
|---|---|---|---|
| 3,824,493 | 7/1974 | Hakki | 331/94.5 H |
| 3,865,646 | 2/1975 | Logan et al. | 156/649 X |
| 3,887,404 | 6/1975 | Chane | 156/647 X |
| 4,121,177 | 10/1978 | Tsukada | 331/94.5 H |
| 4,137,107 | 1/1979 | Nijman et al. | 148/175 X |
| 4,144,503 | 3/1979 | Itoh et al. | 331/94.5 H |
| 4,171,234 | 10/1979 | Nagata et al. | 29/580 X |
| 4,178,564 | 12/1979 | Ladany et al. | 357/18 X |
| 4,230,997 | 10/1980 | Hartman et al. | 331/94.5 H |

OTHER PUBLICATIONS

Itoh et al., "Embedded-Stripe . . . Laser . . . Etched Mirrors", IEEE J. Quantum Electronics, vol. QE 13, No. 8, Aug, 1977, pp. 628-631.

*Primary Examiner*—L. Dewayne Rutledge
*Assistant Examiner*—W. G. Saba
*Attorney, Agent, or Firm*—Thomas A. Briody; Robert T. Mayer; Steven R. Biren

[57] ABSTRACT

An electroluminescent semiconductor device such as a semiconductor laser has epitaxial monocrystalline layers (3 to 6), including an active layer (4), grown on a substrate (2). The epitaxial layers are etched in the presence of an etching mask (8) to form nonplanar mirror surfaces (9) which in the longitudinal direction bound active regions (10). To form flat and parallel mirrors (12) an epitaxial monocrystalline protective layer (11) is grown from the gaseous phase on the mirror surfaces after etching. The etching can be carried out in two stages using different etchants. With the first etchant the etched layers taken on a swallow-tail profile and then with the second etchant they take on a concave profile.

6 Claims, 4 Drawing Figures

FABRICATION OF ELECTROLUMINESCENT SEMICONDUCTOR DEVICE UTILIZING SELECTIVE ETCHING AND EPITAXIAL DEPOSITION

BACKGROUND OF THE INVENTION

The invention relates to a method of manufacturing electroluminescent semiconductor devices, particularly but not exclusively a method of manufacturing semiconductor laser devices, and further relates to electroluminescent semiconductor devices manufactured by such a method.

From IEEE Journal of Quantum Electronics, vol. QE 13, No. 8, August 1977, pp. 628–631, a method is known in which epitaxial layers of n-type gallium aluminum arsenide, p-type gallium arsenide (the active layer), p-type gallium aluminum arsenide and p-type gallium arsenide are formed successively on a substrate of n-type gallium arsenide.

The width of the active regions is then established by etching and the regions are insulated from each other by the selective deposition of polycrystalline gallium arsenide phosphide having a high resistivity. The length of the active regions is then fixed by an etching treatment and the mirror surfaces are formed.

As used herein, the terms "active layer" and "active region" are to be understood to mean a layer and a region respectively in which radiation can be generated.

A disadvantage of the formation of mirror surface by etching is that the said layers often have different etching rates and, in particular, accelerated etching may occur near the interfaces between the layers. Also, the etched surface may show irregularities so that the operation of the device may be adversely influenced.

In practice, therefore, the mirror surfaces are often obtained not by etching but by cleaving the crystal formed by the layers. However, a disadvantage of cleaving is that integration of the active regions with other active or passive components in one crystal is substantially impossible and coupling of the light between discrete active or passive components is a very exacting task. Furthermore, covering the mirrors with a protective layer can be carried out only after cleaving and hence is very time-consuming.

SUMMARY OF THE INVENTION

According to a first aspect of the invention there is provided a method of manufacturing an electroluminescent semiconductor device which method includes the steps of growing epitaxial monocrystalline layers, including an active layer, on a major surface of a substrate, etching the layers in the presence of an etching mask to form mirror surfaces which bound active regions in the longitudinal direction prior to growing from a gaseous phase an epitaxial monocrystalline protective layer on the mirror surfaces.

Because the epitaxial layers are etched the manufacture of electroluminescent semiconductor devices, in particular semiconductor laser devices, can be simpler than known methods in which cleaving is carried out.

Also, flat and parallel mirrors can be obtained which show substantially no unevenness. This is probably associated with the fact that where different etching rates occur, the rate of epitaxial growth from the gaseous phase often is also different. A layer with good adhering and passivating properties can be obtained with which surface recombinations are prevented.

The mirror surfaces are preferably etched in the [$01\bar{1}$] direction or [010] direction. Such directions have a comparatively low etching rate and growth rate. Because of the low growth rate only a comparatively thin protective layer need be grown in these directions and there is only a small possibility that other layers of smaller growth rate start developing in an interfering manner at an angle with the mirror surfaces.

The active layer preferably consists of gallium arsenide or gallium aluminum arsenide and the layers located below and above the active layer preferably comprise gallium aluminum arsenide of mutually opposite conductivity types and having an aluminum content which is at least 25 atom.% larger than that of the active layer.

The protective layer preferably consists of isolating gallium aluminum arsenide having an aluminum content which exceeds that of the active layer. Such a layer is pervious to the generated radiation and traps charge carriers in the active region.

It is preferable for the formation of flat and parallel mirror surfaces that viewed in a lateral direction a concave profile is obtained by the epitaxial layers during etching.

Preferably a swallow-tail profile is obtained by the layers during etching with a first etchant and then a further etchant is used with which etching is carried out nonpreferentially.

The protective epitaxial layer may be provided with other layers in any conventional manner.

The active regions may mutually be bounded, for example, in the direction of width by a proton bombardment.

According to a further aspect of the invention there is provided an electroluminescent semiconductor device manufactured by a method in accordance with the first aspect of the invention in which the active regions are integrated with other active and/or passive elements.

BRIEF DESCRIPTION OF THE DRAWING

An embodiment of the invention will now be described, by way of example, with reference to the accompanying drawing, in which.

DETAILED DESCRIPTION

Figure 1:
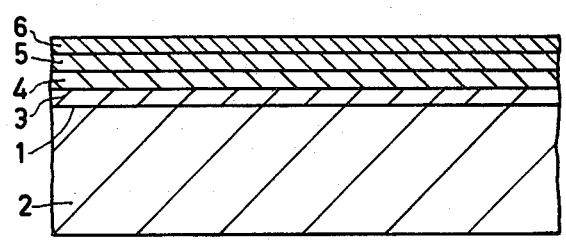
FIGS. 1, 2, 3 and 4 are diagrammatic sectional views at successive stages in the manufacture of an electroluminescent semiconductor device by a method according to the invention.
Figure 4:
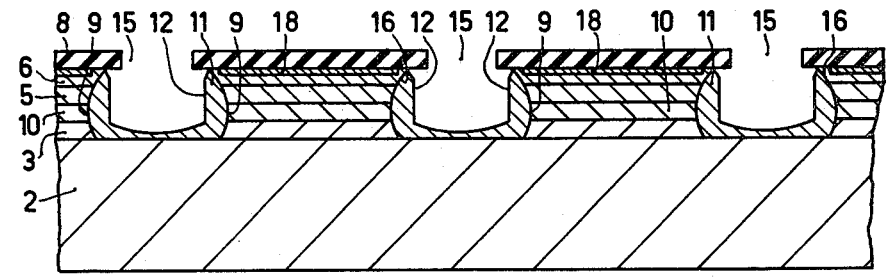

In the present method, for example, a semiconductor laser device is manufactured in which epitaxial layers 3, 4, 5 and 6, including an active layer 4 (see FIG. 1) are grown on a major surface 1 of a substrate 2. The layers 3, 4, 5 and 6 are then etched with the use of an etching mask 8, mirror surfaces 9 being obtained to bound active regions 10 in the longitudinal direction (see FIG. 4).

According to the invention, an epitaxial monocrystalline protective layer 11 is grown from a gaseous phase on the mirror surfaces 9 after etching.

Flat, parallel mirrors 12 can be obtained.

Mirror surfaces 9 are preferably etched in the [$01\bar{1}$] direction or [010] direction since the etching and growth rates in these directions are comparatively small and flat and parallel mirrors 12 are obtained after the growth of only comparatively thin layers 11.

Figure 3:
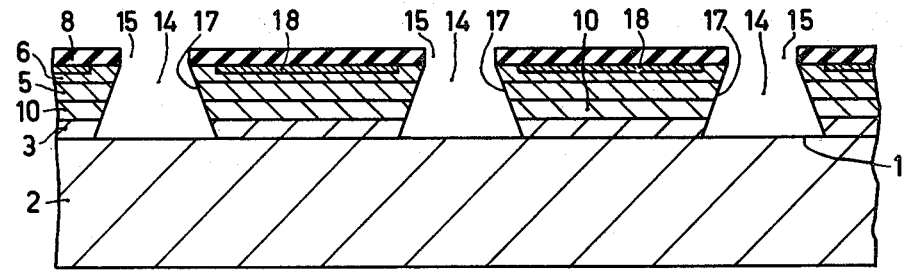

Good mirrors are obtained in particular when during etching a concave profile 16 is obtained, viewed in a lateral direction. For that purpose, a first etchant is preferably used to obtain a swallow-tail profile (see FIG. 3) and then a further etchant is used with which etching is performed nonpreferentially.

In the method according to the invention a (100) major surface 1 of a gallium arsenide substrate 2 of the n-conductivity type having a donor concentration of $8 \times 10^{17}/cm^3$ can be provided in a usual manner by means of liquid phase epitaxy with successively an n-type gallium arsenide layer (not shown) having the same donor concentration as the substrate and a thickness of 8 μm, an n-type gallium aluminum arsenide layer 3 having a donor concentration of $3 \times 10^{17}$ per $cm^3$, a thickness of 1.5 μm and an atom fraction of aluminum relative to aluminum plus gallium equal to 0.30 and an active layer 4 of gallium arsenide or gallium aluminium arsenide having an atom fraction of aluminium relative to aluminium plus gallium between 0 and 0.05, a thickness of 0.3 μm and a concentration of acceptors smaller than $1 \times 10^{17}$ per $cm^3$.

A p-type gallium aluminium arsenide layer 5 having an acceptor concentration of $5 \times 10^{17}$ per $cm^3$, a thickness of 1.5 μm and an atom fraction of aluminum relative to aluminum plus gallium equal to 0.30 is then grown in a usual manner on the layer 4 and a p-type gallium arsenide layer 6 having an acceptor concentration of $5 \times 10^{17}$ per $cm^3$ and a thickness of 1 μm is grown on layer 5.

Figure 2:
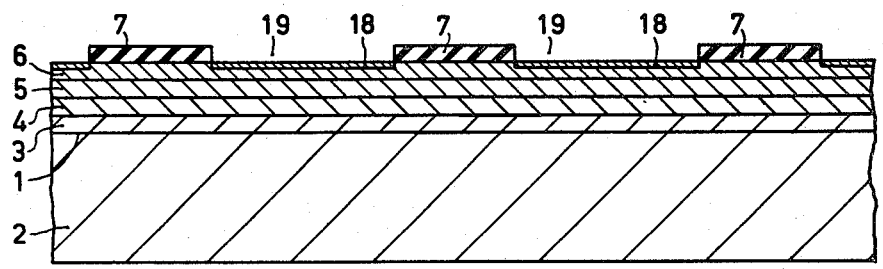

In order to obtain strip-shaped lasers approximately 5 μm wide and approximately 250 μm long, the surface of layer 6 is provided with a 0.15 μm thick aluminum oxide layer 7 by vapor deposition using an electron gun (see FIG. 2).

In a usual manner, apertures 19, which are shown in FIG. 2 in the longitudinal direction and which are 5 μm and 250 μm long, are made in said aluminum oxide layer in the $[01\bar{1}]$ direction at a mutual distance in the direction of width of 300 μm and of 50 μm in the longitudinal direction.

Zinc contact diffusion regions 18 are formed in the layer 6 via apertures 19.

A second aluminum oxide layer is then provided over the surface at the apertures 19. An etching mask 8 is formed in the usual manner from the aluminum oxide layer.

By means of an etching bath consisting of 1 part by volume of ammonia 25% by weight, 1 part by volume of hydrogen peroxide 30% by weight and 1 part by volume of water, channels 14 in the [011] direction having a swallow-tail profile 17 are etched in the layers 3, 4, 5 and 6 via 30 μm wide apertures 15 in the etching mask 8, which channels are approximately 40 μm wide at the major surface 1.

Via the same apertures 15, etching is then carried out with a bath consisting of 3 parts by volume of concentrated sulphuric acid, 1 part by volume of hydrogen peroxide 30% by weight and 1 part by volume of water, the swallow-tail profile 17 of the edges of the epitaxial layer segments changing into a concave profile 16.

A monocrystalline protective layer 11 of gallium aluminum arsenide is then grown from the gaseous phase in a usual manner. The said gaseous phase comprises trimethyl gallium, trimethyl aluminum and hydrogen arsenic in hydrogen as a carrier gas. Layer 11 is of the n-type, but not intentionally doped, has an atom fraction of aluminum relative to aluminium plus gallium of 0.30, a thickness of 1.5 μm and a donor concentration of approximately $5 \times 10^{16}$ $cm^3$. The resistance of isolating layer 11 is higher than that of layer 4 so that a short-circuit does not occur between the layers 3 and 5 via layer 11. Flat and parallel mirrors in the $[01\bar{1}]$ direction are thus obtained.

The indicated thickness of layer 11 applies in particular to the central portion, said thickness may be different near the major surface 1 and near layer 6.

Polycrystalline gallium aluminum arsenide (not shown) deposits on the etching mask and can be removed by means of a redox etching bath consisting of 50 $cm^3$ of water, 2.5 $cm^3$ of concentrated sulphuric acid, 4 g of cuprous chloride and 875 mg of cupric chloride. The windows in the first aluminum oxide layer 7 are then opened again to provide contacts.

The length of the active regions 10 is 260 μm.

The laser devices are completed in the usual manner.

It will be obvious that a method in accordance with the invention is not restricted to the example described but that many variations are possible without departing from the scope of the invention.

A layer of aluminum oxide may be provided on the protective layer 11 against atmospheric influences.

The active regions, for example, may be bounded simultaneously in the directions of width and length by etching. Front and side faces may then be provided simultaneously with a protective layer.

Electroluminescent semiconductor devices which are integrated with other passive and/or active elements, such as light conductors and photodetectors, can be manufactured by means of a method in accordance with the invention.

Instead of the etching method described in which a concave etching profile is obtained, etching may also be carried out by means of sputtering in which in one etching step a profile is obtained which is at right angles to the layers 3, 4, 5 and 6.

What is claimed is:

1. A method of manufacturing a semiconductor laser device, which comprises:
   providing a semiconductor substrate having a major surface;
   growing a plurality of monocrystalline epitaxial layers, including an active layer, on said major surface;
   providing an etching mask on top of said monocrystalline epitaxial layers;
   etching the masked monocrystalline epitaxial layers to form a plurality of epitaxial layer segments having nonplanar mirror surfaces which bound segments of said active layer in the lateral direction; and
   then growing epitaxial monocrystalline protective layers having substantially planar and parallel surfaces on said nonplanar mirror surfaces from the gaseous phase.

2. A method as claimed in claim 1, in which the monocrystalline epitaxial layers are etched in a direction selected from the $[01\bar{1}]$ direction and the [010] direction.

3. A method as claimed in claim 1 or 2, in which the active layer comprises a material selected from the materials gallium arsenide and gallium aluminum arsenide, and the layers situated above and below the active layer comprise gallium aluminum arsenide of mutually opposite conductivity types and having an aluminum content which is at least 25 atom% larger than that of the active layer.

4. A method as claimed in claim 3, in which the protective layer comprises isolating gallium aluminum arsenide having an aluminum content which exceeds that of the active layer.

5. A method as claimed in claim 1, in which, viewed in the laterial direction, the monocrystalline epitaxial layers are etched to obtain concave mirror surfaces.

6. A method as claimed in claim 5, wherein the monocrystalline epitaxial layers are etched to obtain said concave surfaces by first etching with a first etchant to obtain a swallow-tail profile and then nonpreferentially etching with a second etchant to obtain said concave surfaces.

* * * * *